(12) United States Patent
Howald et al.

(10) Patent No.: US 8,454,794 B2
(45) Date of Patent: *Jun. 4, 2013

(54) ANTENNA FOR PLASMA PROCESSOR AND APPARATUS

(75) Inventors: Arthur M. Howald, Pleasanton, CA (US); Andras Kuthi, Thousand Oaks, CA (US)

(73) Assignee: Lam Research Corporation, Fremont, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/524,734

(22) Filed: Jun. 15, 2012

(65) Prior Publication Data

US 2012/0248978 A1    Oct. 4, 2012

Related U.S. Application Data

(60) Continuation of application No. 13/020,170, filed on Feb. 3, 2011, now Pat. No. 8,277,604, which is a division of application No. 11/044,269, filed on Jan. 28, 2005, now Pat. No. 7,905,982, which is a continuation of application No. 10/334,063, filed on Dec. 31, 2002, now Pat. No. 6,876,155.

(51) Int. Cl.
*H01L 21/306* (2006.01)
*C23C 16/00* (2006.01)

(52) U.S. Cl.
USPC ............. 156/345.48; 118/723 I; 118/723 AN; 315/111.51

(58) Field of Classification Search
USPC ....... 118/723 I, 723 IR, 723 AN; 156/345.48, 156/345.49; 315/111.51
See application file for complete search history.

(56) References Cited

U.S. PATENT DOCUMENTS

| | | |
|---|---|---|
| 4,849,675 A | 7/1989 | Mueller |
| 4,948,458 A | 8/1990 | Ogle |
| 5,017,835 A * | 5/1991 | Oechsner ................ 315/111.81 |
| 5,226,967 A | 7/1993 | Chen et al. |
| 5,277,751 A | 1/1994 | Ogle |
| 5,304,279 A | 4/1994 | Coultas et al. |
| 5,368,710 A | 11/1994 | Chen et al. |
| 5,368,967 A | 11/1994 | Schank et al. |
| 5,401,350 A | 3/1995 | Patrick et al. |
| 5,558,722 A | 9/1996 | Okumura et al. |
| 5,731,565 A | 3/1998 | Gates |
| 5,759,280 A | 6/1998 | Holland et al. |
| 5,759,429 A | 6/1998 | Trimmer et al. |
| 5,795,429 A | 8/1998 | Ishii |
| 5,800,619 A | 9/1998 | Holland et al. |
| 5,897,712 A | 4/1999 | Hanawa et al. |
| 5,897,713 A | 4/1999 | Tomioka et al. |
| 5,964,949 A | 10/1999 | Savas |
| 6,016,131 A | 1/2000 | Sato et al. |
| 6,028,285 A | 2/2000 | Khater et al. |

(Continued)

FOREIGN PATENT DOCUMENTS

EP    0820086 A1    1/1998

*Primary Examiner* — Luz Alejandro Mulero

(74) *Attorney, Agent, or Firm* — Klintworth & Rozenblat IP LLC

(57) ABSTRACT

An antenna includes excitation terminals responsive to an RF source to supply an RF electromagnetic field to a plasma that processes a workpiece in a vacuum chamber. The coil includes a transformer having a primary winding coupled to the excitation terminals and a multi-turn plasma excitation secondary winding connected in series with a capacitor.

13 Claims, 9 Drawing Sheets

U.S. PATENT DOCUMENTS

| | | |
|---|---|---|
| 6,310,577 B1 | 10/2001 | Ra |
| 6,320,320 B1 * | 11/2001 | Bailey et al. ............. 315/111.51 |
| 6,331,754 B1 | 12/2001 | Satoyoshi et al. |
| 6,341,574 B1 | 1/2002 | Bailey, III et al. |
| 6,353,206 B1 | 3/2002 | Roderick |
| 6,414,648 B1 | 7/2002 | Holland et al. |
| 6,441,555 B1 | 8/2002 | Howald et al. |
| 6,508,198 B1 | 1/2003 | Hoffman et al. |
| 6,653,791 B1 | 11/2003 | Bailey, III et al. |
| 8,277,604 B2 * | 10/2012 | Howald et al. ........... 156/345.48 |
| 2002/0130110 A1 * | 9/2002 | Kwon et al. ............. 219/121.54 |

* cited by examiner

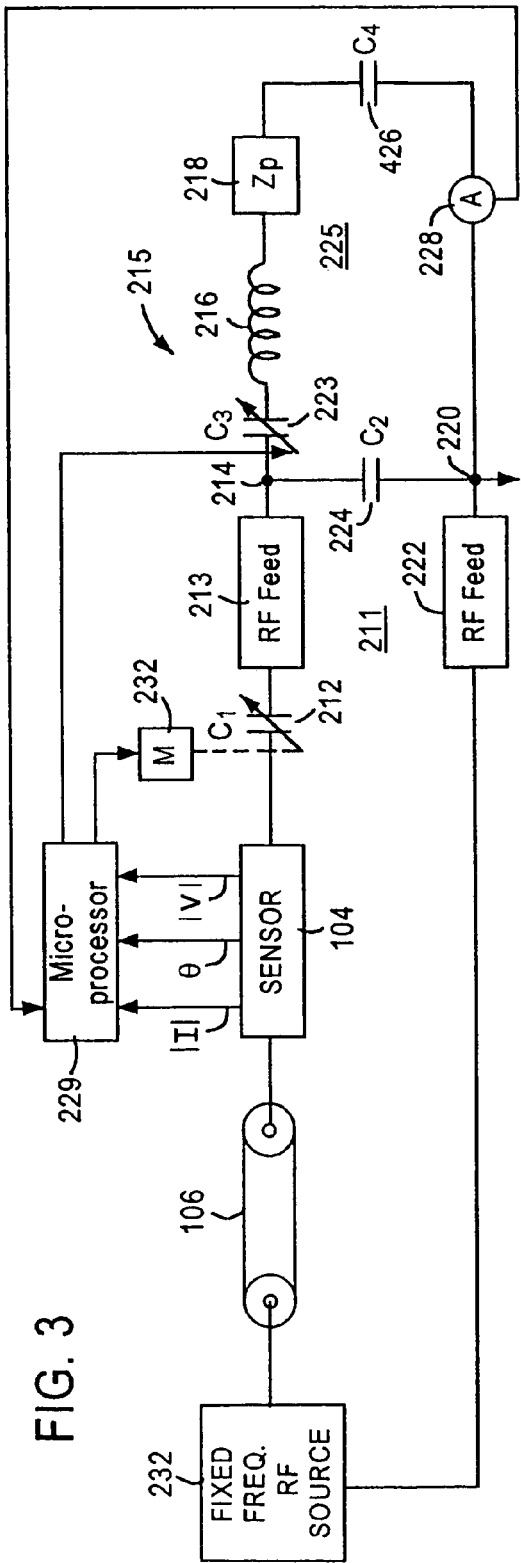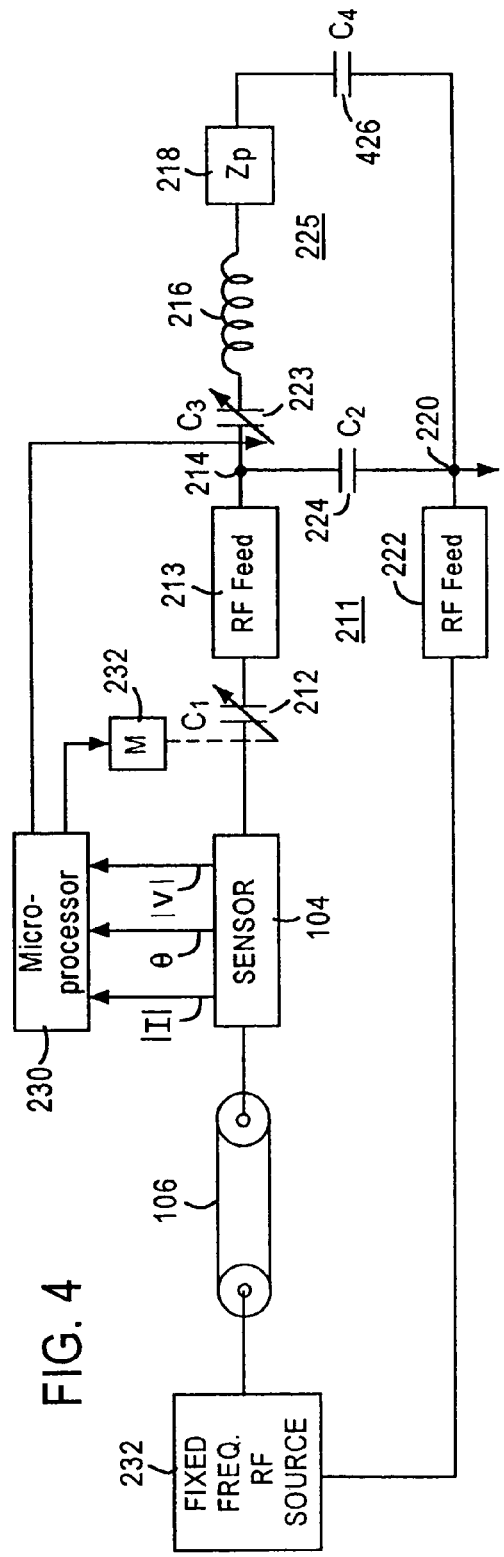

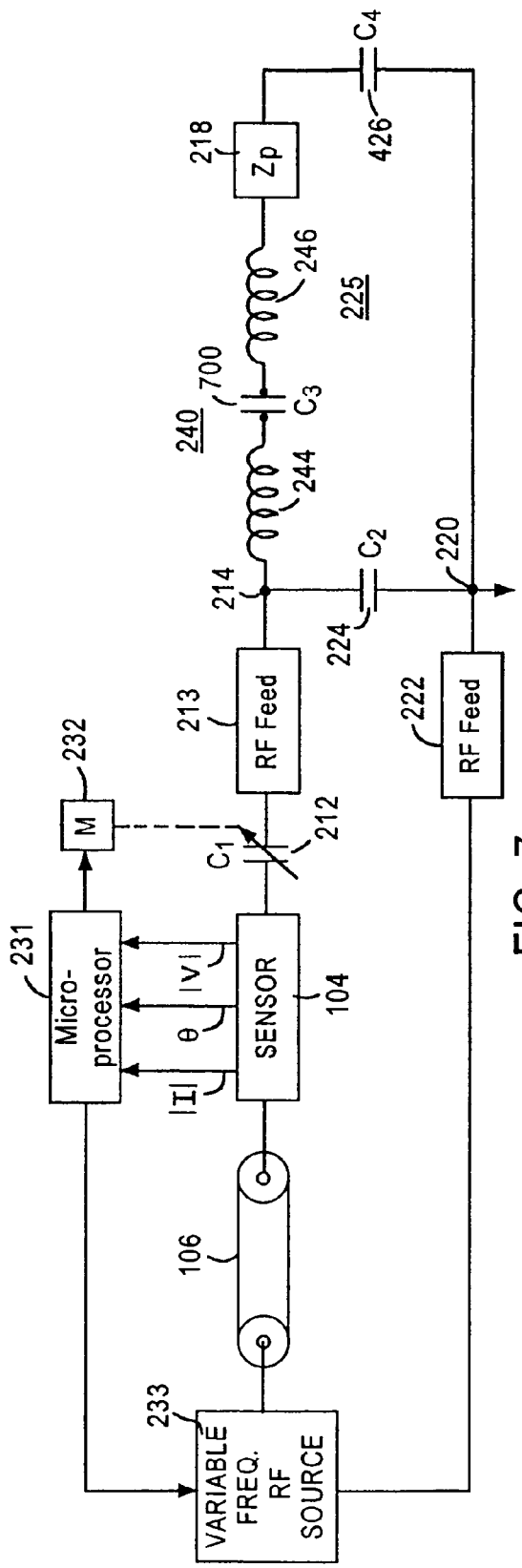
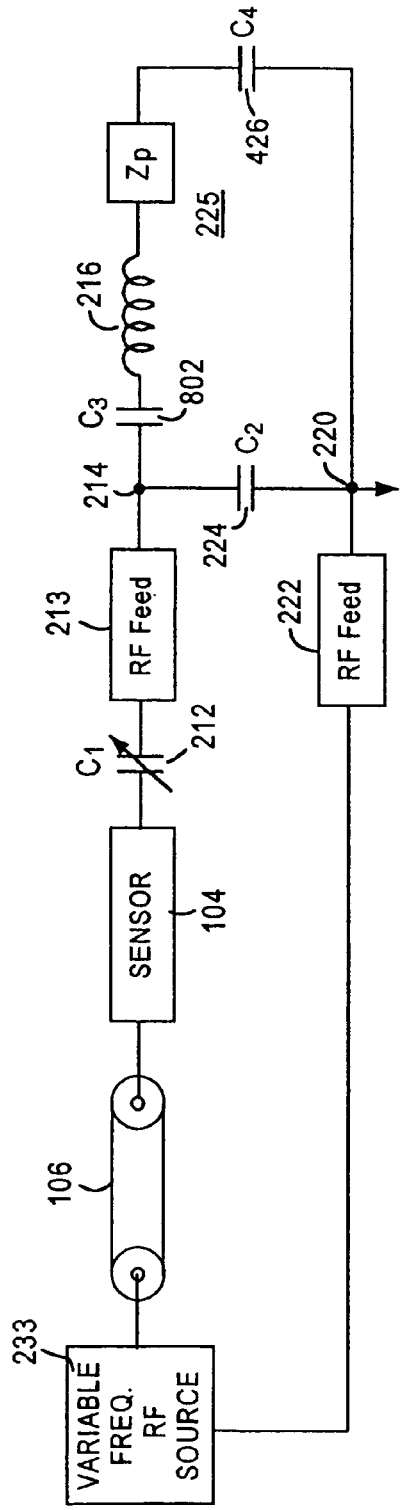
FIG. 7
FIG. 8

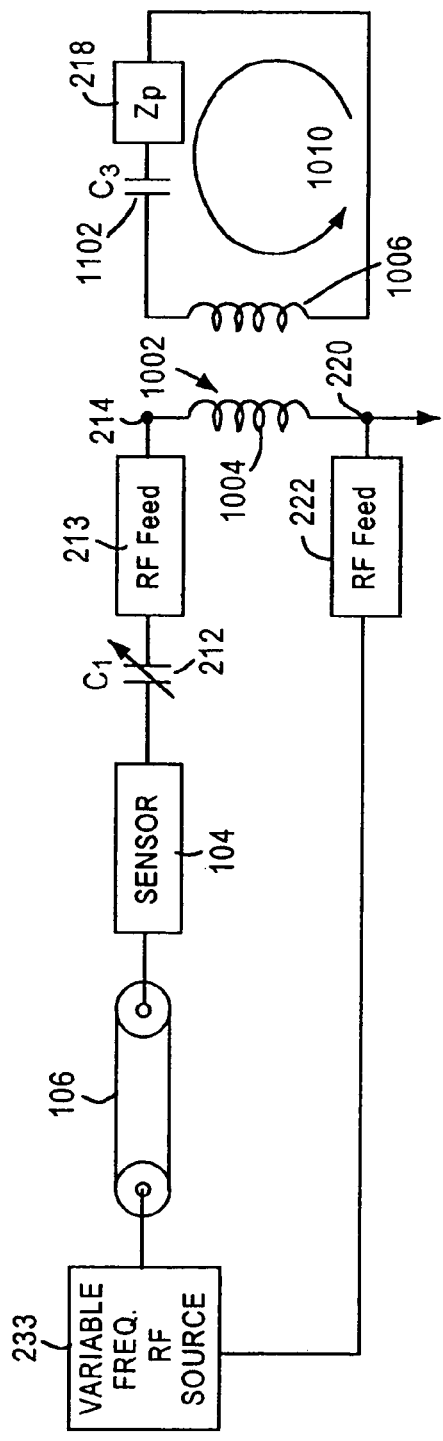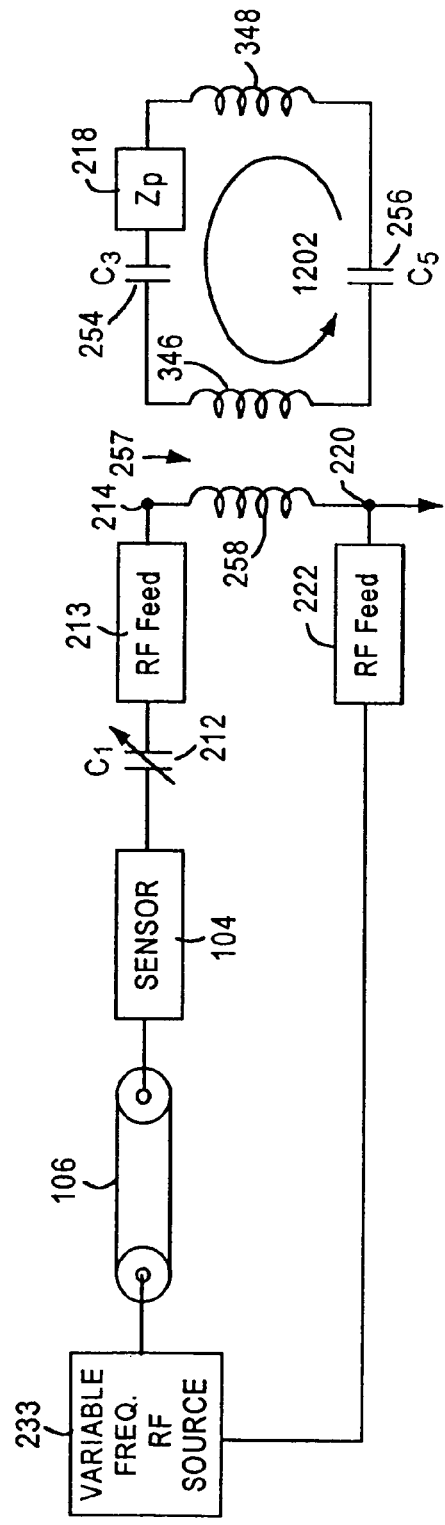

US 8,454,794 B2

ANTENNA FOR PLASMA PROCESSOR AND APPARATUS

RELATED APPLICATIONS

Certain aspects of the present application include subject matter disclosed in the commonly assigned Howald et al. application Ser. Nos. 10/227,275 filed Aug. 26, 2002, (U.S. Pat. No. 6,646,385, which was filed as a continuation of U.S. Pat. No. 6,441,555) and Ser. No. 10/200,833 filed Jul. 22, 2002 (U.S. Pat. No. 6,842,147). This application is a continuation of U.S. application Ser. No. 13/020,170, filed Feb. 3, 2011, which was a continuation of U.S. application Ser. No. 11/044,269 (U.S. Pat. No. 7,905,982, filed Jan. 28, 2005, which was a divisional of Ser. No. 10/334,063 (U.S. Pat. No. 6,876,155), filed Dec. 31, 2002.

FIELD OF INVENTION

The present invention relates generally to plasma processor antennas and, more particularly, to a plasma processor antenna having primary and secondary windings.

BACKGROUND ART

A typical prior art workpiece processor, as illustrated in FIG. 1, includes vacuum plasma processing chamber assembly 10, a first circuit 12 for driving a planar excitation antenna 48 consisting of a coil for exciting ionizable gas in chamber assembly to a plasma state, a second circuit 14 for applying RF bias to a workpiece holder in chamber assembly 10, and a controller arrangement 16 responsive to sensors for various parameters associated with chamber assembly 10 for deriving control signals for devices affecting the plasma in chamber assembly 10. Controller 16 includes microprocessor 20 which responds to various sensors associated with chamber assembly 10, as well as circuits 12 and 14, and signals from operator input 22, which can be in the form, for example, of a keyboard. Microprocessor 20 is coupled with memory system 24 including hard disk 26, random access memory (RAM) 28 and read only memory (ROM) 30. Microprocessor 20 responds to the various signals supplied to it to drive display 32, which can be a typical computer monitor.

Hard disk 26 and ROM 30 store programs for controlling the operation of microprocessor 20 and preset data associated with different recipes for the processes performed in chamber assembly 10. The different recipes concern gas species and flow rates applied to chamber assembly 10 during different processes, the output power of AC sources included in circuits 12 and 14, the vacuum applied to the interior of chamber assembly 10, and initial values of variable reactances included in matching networks of circuits 12 and 14.

Plasma chamber assembly 10 includes chamber 40 having non-magnetic cylindrical side wall 42 and non-magnetic base 44, both of which are frequently metal and electrically grounded. Dielectric, typically quartz, window 46 is fixedly positioned on the top edge of wall 42.

Wall 42, base 44 and window 46 are rigidly connected to each other by suitable gaskets to enable a vacuum to be established within the interior of chamber 40. Plasma excitation antenna 48 includes coil 49, that is planar or dome shaped, and can be configured as disclosed in Ogle, U.S. Pat. No. 4,948,458 or Holland et al., U.S. Pat. No. 5,759,280 or Holland et al, U.S. Pat. No. 5,800,619 sits on or in very close proximity to the upper face of window 46. Antenna 48 reactively supplies magnetic and electric RF fields to the interior of chamber 40, to excite ionizable gas in the chamber to a plasma, schematically illustrated in FIG. 1 by reference numeral 50.

The upper face of base 44 carries holder (i.e. chuck) 52 for workpiece 54, which is typically a circular semiconductor wafer, a rectangular dielectric plate such as used in flat panel displays or a metal plate. Workpiece holder 52 typically includes metal plate electrode 56 which carries dielectric layer 58 and sits on dielectric layer 60, which is carried by the upper face of base 44. A workpiece handling mechanism (not shown) places workpiece 54 on the upper face of dielectric layer 58. Workpiece 54 is cooled by supplying helium from a suitable source 62 to the underside of dielectric layer 58 via conduit 64 and grooves (not shown) in electrode 56. With workpiece 54 in place on dielectric layer 58, d.c. source 66 supplies a suitable voltage through a switch (not shown) to electrode 56 to clamp, i.e., chuck, workpiece 54 to holder 52.

With workpiece 54 secured in place on chuck 52, one or more ionizable gases from one or more sources 68 flow into the interior of chamber 40 through conduit 70 and port 72 in sidewall 42. For convenience, only one gas source 68 is shown in FIG. 1. The interior of conduit 70 includes valve 74 and flow rate gauge 76 for respectively controlling the flow rate of gas flowing through port 72 into chamber 40 and measuring the gas flow rate through port 72. Valve 74 responds to a signal microprocessor 20 derives, while gauge 76 supplies the microprocessor with an electric signal indicative of the gas flow rate in conduit 70. Memory system 24 stores for each recipe of each workpiece 54 processed in chamber 40 a signal indicative of desired gas flow rate in conduit 70. Microprocessor 20 responds to the signal memory system 24 stores for desired flow rate and the monitored flow rate signal gauge 76 derives to control valve 74 accordingly.

Vacuum pump 80, connected to port 82 in base 44 of chamber 40 by conduit 84, evacuates the interior of the chamber to a suitable pressure, typically in the range of one to one hundred milliTorr. Pressure gauge 86, in the interior of chamber 40, supplies microprocessor 20 with a signal indicative of the vacuum pressure in chamber 40.

Memory system 24 stores for each recipe a signal indicative of desired vacuum pressure for the interior of chamber 40. Microprocessor 20 responds to the stored desired pressure signal memory system 24 derives for each recipe and an electric signal from pressure gauge 86 to supply an electric signal to vacuum pump 80 to maintain the pressure in chamber 40 at the set point or predetermined value for each recipe.

Optical spectrometer 90 monitors the optical emission of plasma 50 by responding to optical energy emitted by the plasma and coupled to the spectrometer via window 92 in side wall 42. Spectrometer 90 responds to the optical energy emitted by plasma 50 to supply an electric signal to microprocessor 20. Microprocessor 20 responds to the signal spectrometer 90 derives to detect an end point of the process (either etching or deposition) that plasma 50 is performing on workpiece 54. Microprocessor 20 responds to the signal spectrometer 90 derives and a signal memory system 24 stores indicative of a characteristic of the output of the spectrometer associated with an end point to supply the memory with an appropriate signal to indicate the recipe has been completed. Microprocessor 20 then responds to signals from memory system 24 to stop certain activities associated with the completed recipe and initiate a new recipe on the workpiece previously processed in chamber 40 or commands release of workpiece 54 from chuck 52 and transfer of a new workpiece to the chuck, followed by instigation of another series of processing recipes.

Excitation circuit 12 for driving coil 49 of antenna 48 includes constant or variable frequency RF source 100 (see Barnes et al U.S. Pat. No. 5,892,198), typically having a frequency of 4.0±10% MHz or 13.56±10% MHz. Source 100 drives variable gain power amplifier 102, typically having an output power in the range between 100 and 3000 watts. Amplifier 102 typically has a 50 ohm output impedance all of which is resistive and none of which is reactive. Hence, the impedance seen looking back into the output terminals of amplifier 102 is typically represented by (50+j0) ohms, and cable 106 is chosen to have a characteristic impedance of 50 ohms.

For any particular recipe, memory system 24 stores a signal for desired output power of amplifier 112. Memory system 24 supplies the desired output power of amplifier 102 to the amplifier by way of microprocessor 20. The output power of amplifier 102 can be controlled in an open loop manner in response to the signals stored in memory system 24 or control of the output power of amplifier 102 can be on a closed loop feedback basis, as known in the art.

The output power of amplifier 102 drives coil 49 via cable 106 and matching network 108. Matching network 108, configured as a "T," includes two series legs including variable capacitors 112 and 116, as well as a shunt leg including fixed capacitor 114. The antenna 48 includes excitation terminals 122 and 124, respectively connected to (1) a first end of coil 49 and one electrode of capacitor 112 and (2) a second end of coil 49 and a first electrode of series capacitor 126, having a grounded second electrode; or terminal 124 can be connected directly to ground. The value of capacitor 126 is preferably selected as described in the commonly assigned, previously mentioned, Holland et al. '200 patent.

Electric motors 118 and 120, preferably of the step type, respond to signals from microprocessor 20 to control the values of capacitors 112 and 116 in relatively small increments to maintain an impedance match between the impedance seen by looking from the output terminals of amplifier 102 into cable 106 and by looking from cable 106 into the output terminals of amplifier 102. Hence, for the previously described (50+j0) ohm output impedance of amplifier 102 and 50 ohm characteristic impedance of cable 106, microprocessor 20 controls motors 118 and 120 so the impedance seen looking from cable 106 into matching network 108 is as close as possible to a matched impedance of (50+j0) ohms. Alternatively, microprocessor 20 controls the frequency of source 100 and the capacitance of capacitor 116 to achieve a matched impedance between the source and the load it drives. As a result of a matched impedance being attained, the current flowing through capacitors 112 and 126 and the leads connecting the capacitors to terminals 122 and 124, is typically within a couple of percent of its very high maximum value. The very high current in these leads has an adverse effect on the uniformity of the density of plasma 50.

To control motors 118 and 120 or the frequency of source 100 and motor 120 to maintain matched conditions between the impedance seen looking into the output terminals of amplifier 102 and the impedance amplifier 102 drives, microprocessor 20 responds to signals from conventional sensor arrangement 104. The signals are indicative of the impedance seen looking from cable 106 into matching network 108; usually the signals represent the absolute values of the current and voltage reflected toward the sensor from capacitor 118, and the phase angle between the reflected current and voltage. Alternatively, sensors are provided for deriving signals indicative of the power that amplifier 102 supplies to its output terminals and the power reflected by cable 106 back to the output of amplifier 102. Microprocessor 20 responds, in one of several known manners, to the sensed signals sensor arrangement 104 derives to control motors 118 and 120 or the frequency of source 100 and motor 120 to attain the matched condition.

Because of variations in conditions in the interior of chamber 40 which affect plasma 50, the plasma has a variable impedance. The conditions are aberrations in the flow rate and species of the gas flowing through port 72, aberrations in the pressure in chamber 40 and other factors. In addition, noise is sometimes supplied to motors 118 and 120 causing the motors to change the values of capacitors 112 and 116. All of these factors affect the impedance reflected by the load including plasma 50 back to the output terminals of amplifier 102. Microprocessor 20 responds to the output signals of sensor 104, to vary the values of capacitors 112 and 116 or the frequency of source 100, to maintain the impedance driven by the output terminals of amplifier 102 matched to the output impedance of the amplifier.

Circuit 14 for supplying RF bias to workpiece 54 via electrode 56 has a construction somewhat similar to circuit 12. Circuit 14 includes constant frequency RF source 130, typically having a frequency such as 400 kHz, 2.0 MHz or 13.56 MHz. The constant frequency output of source 130 drives variable gain power amplifier 132, which in turn drives a cascaded arrangement including directional coupler 134, cable 136 and matching network 138. Matching network 138 includes a series leg comprising the series combination of fixed inductor 140 and variable capacitor 142, as well as a shunt leg including fixed inductor 144 and variable capacitor 146. Motors 148 and 150, which are preferably step motors, vary the values of capacitors 142 and 146, respectively, in response to signals from microprocessor 20.

Output terminal 152 of matching network 138 supplies an RF bias voltage to electrode 56 by way of series coupling capacitor 154 which isolates matching network 138 from the chucking voltage of d.c. source 66. The RF energy circuit 14 applies to electrode 56 is capacitively coupled via dielectric layer 48, workpiece 54 and a plasma sheath between the workpiece and plasma to a portion of plasma 50 in close proximity with chuck 52. The RF energy chuck 52 couples to plasma 50 establishes a d.c. bias in the plasma; the d.c. bias typically has values between 50 and 1000 volts. The d.c. bias resulting from the RF energy circuit 14 applies to chuck 52 accelerates ions in the plasma 50 to workpiece 54.

Microprocessor 20 responds to signals indicative of the impedance seen looking from cable 136 into matching network 138, as derived by a known sensor arrangement 139, to control motors 148 and 150 and the values of capacitors 142 and 146 in a manner similar to that described supra with regard to control of capacitors 112 and 116 of matching network 108.

For each process recipe, memory system 24 stores a set point signal for the net power flowing from directional coupler 134 into cable 136. The net power flowing from directional coupler 134 into cable 136 equals the output power of amplifier 132 minus the power reflected from the load and matching network 138 back through cable 136 to the terminals of directional coupler 134 connected to cable 136. Memory system 28 supplies the net power set point signal associated with circuit 14 to microprocessor 20. Microprocessor 20 responds to the net power set point signal associated with circuit 14 and the output signals that directional coupler 134 supply to power sensor arrangement 141. Power sensor arrangement 141 derives signals indicative of output power of amplifier 132 and power reflected by cable 136 back toward the output terminals of amplifier 132.

FIG. 2 is a perspective view of an antenna consisting of a planar coil of the type schematically illustrated in FIG. 6 of the previously mentioned '619 patent and which has been incorporated as the coil of antenna 48 in processors of the type illustrated in FIG. 1. The coil illustrated in FIG. 2 includes a single winding 160 including inner and outer concentric metal turns 162 and 164, each of which has a square cross-section and is shaped as a sector of a circle extending through an angle of approximately 340 degrees. Opposite ends of turns 162 and 164 respectively include excitation terminals 166 and 168, respectively connected by metal posts (i.e. current feeds) 170 and 172 to one electrode of capacitor 112 of matching network 108 and to one electrode of capacitor 126; alternatively, post 172 connects excitation terminal 168 to ground directly. Consequently, the RF (i.e. AC) current which flows in posts 170 and 172 is approximately equal to the RF current which flows in turns 162 and 164. The ends of turns 162 and 164 remote from terminals 166 and 168 are connected to each other by straight metal strut 174 that extends generally radially between turns 162 and 164 and has the same cross-sectional configuration as the turns.

The two turn coil of FIG. 2 differs from an ideal two turn coil which consists of two coaxial circular loops having constant, equal amplitude RF currents flowing therein throughout the length of each loop. Such an ideal two turn coil would provide, to the plasma 50 in chamber 40, electric and magnetic fields having complete cylindrical symmetry. The coil of FIG. 2, as well as all practical coils that can be used as the coil of antenna 48, has connections (such as strut 174 that connects turns 162 and 164) between any loops or windings included in the coil, and current feed points, such as excitation terminals 166 and 168 that connect posts 170 and 172 to turns 162 and 164. These connections prevent all practical coils from having the complete cylindrical symmetry of the idealized coil.

The currents in the practical coil of FIG. 2 can be expressed as the sum of the current in the ideal portions of the coil, i.e., turns 162 and 164, plus the current in a hypothetical perturbation coil that includes terminals 166 and 168, posts 170 and 172, and strut 174. The hypothetical perturbation coil thus includes the effects of the current feeds formed by posts 170 and 172, the "missing" sections of the loops formed by turns 162 and 164, as well as strut 174 which forms a connection between the loops formed by turns 162 and 164. The current flowing in the hypothetical perturbation coil, including the high current flowing in the current feeds formed by posts 170 and 172, has a tendency to cause azimuthal asymmetry in the magnetic field coupled by the coil to the plasma, resulting in azimuthal asymmetry in the plasma density processing the workpiece.

One object of the present invention is to provide a new and improved plasma processor including a plasma having a density with reduced azimuthal asymmetry.

Another object of the present invention is to provide a new and improved antenna arrangement for a plasma processor.

An added object is to provide a new and improved plasma processor antenna arrangement for enabling the plasma of the processor to have density with relatively low asymmetry.

An additional object of the present invention is to provide a new and improved antenna arrangement for a plasma processor, wherein the antenna arrangement is arranged so that the perturbing effects of RF feeds that supply current to the antenna arrangement are reduced compared to a typical prior art arrangement.

A further object of the present invention is to provide a new and improved plasma processor wherein a relatively high current flows in a plasma excitation coil of an antenna while a substantially lower amplitude current flows in the leads connecting the antenna to circuitry which drives the antenna.

SUMMARY OF THE INVENTION

One aspect of the invention relates to a plasma processor antenna adapted to be driven by power from an AC source for exciting a plasma. The antenna comprises first and second excitation terminals, as well as a coil including a primary winding having opposite ends respectively coupled with the first and second excitation terminals, and a secondary winding reactively coupled with the primary winding. A capacitor has first and second opposite electrodes respectively connected in series with the secondary winding.

A further aspect of the invention relates to an antenna for a plasma processor. The antenna is adapted to be driven by power from an AC source for exciting a plasma and comprises first and second excitation terminals, as well as a coil including (1) a primary winding having opposite ends respectively coupled with the first and second excitation terminals, and (2) a secondary winding reactively coupled with the primary winding. The secondary winding includes plural turns.

Preferably, the turns are in different parallel planes adapted to be spatially parallel to a coupling window of a vacuum chamber of the processor. The plural turns are also preferably concentric with an axis of the coil. In such case, the primary winding includes at least one further turn that is concentric with the coil axis and is in a plane spatially parallel to the plural turns of the secondary winding and the secondary winding includes multiple turns in each of the planes. The turns of the secondary winding are preferably connected in series with each other and arranged so AC current induced to them in response to excitation of the primary winding flows in the same direction through half planes extending from the axis through the turns.

The above and still further objects, features and advantages of the present invention will become apparent upon consideration of the following detailed descriptions of several specific embodiments thereof, especially when taken in conjunction with the accompanying drawings.

BRIEF DESCRIPTION OF THE DRAWING

FIGS. 3-12 are schematic diagrams of different embodiments of drive networks in combination with several antenna embodiments, in accordance with preferred embodiments of the present invention;

DETAILED DESCRIPTION OF FIGS. 3-16

Figure 1:
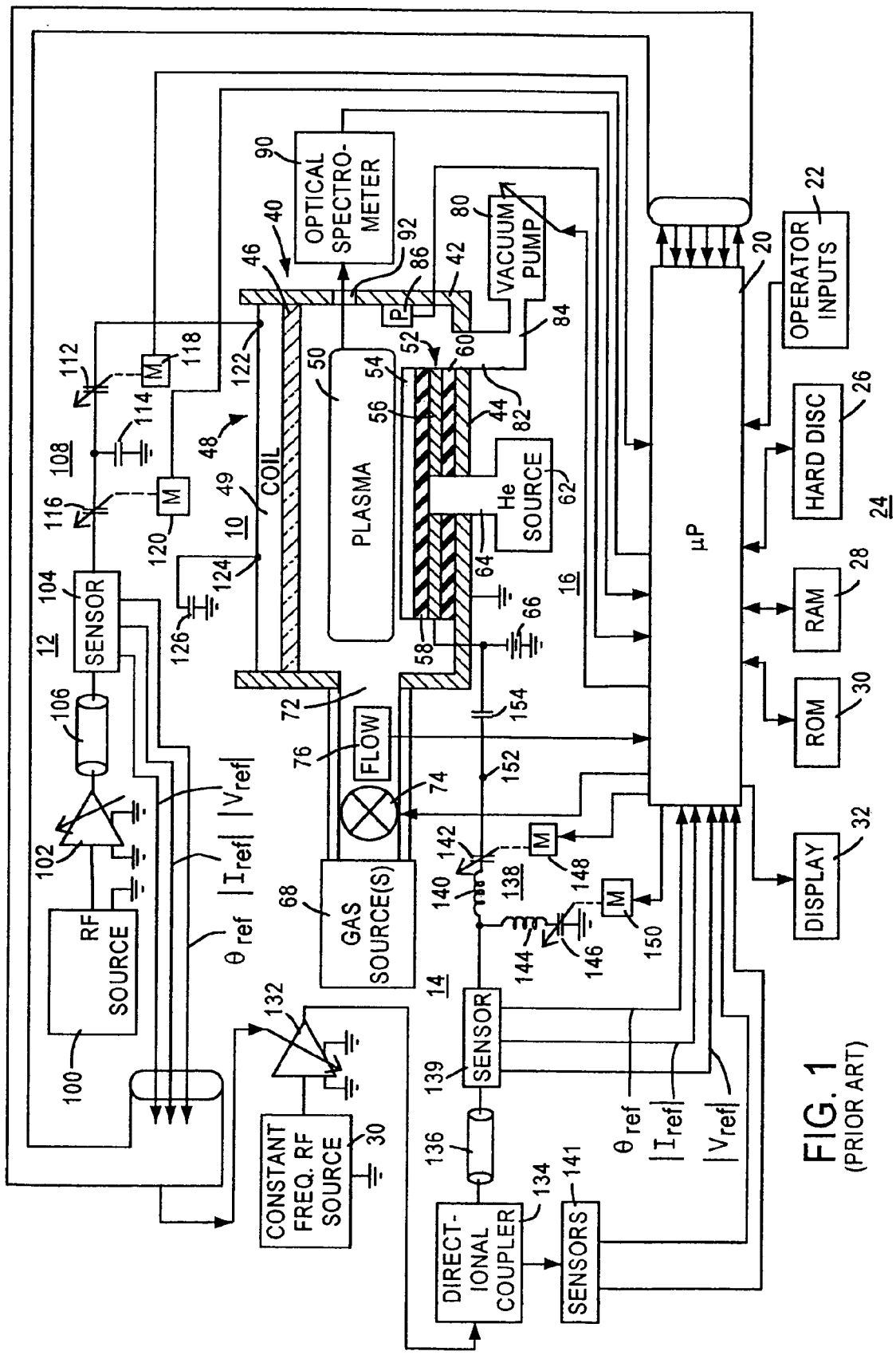
FIG. 1, as previously described, is a schematic diagram of a prior art vacuum plasma processor.
Figure 2:
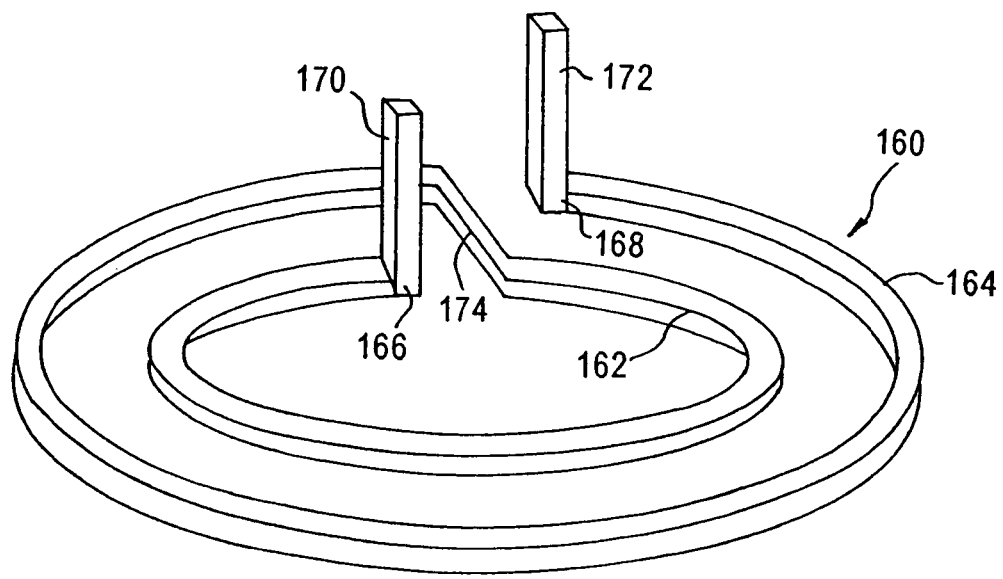
FIG. 2, as previously described, is a perspective view of an antenna coil of the type which has been employed in the vacuum plasma processor of FIG. 1.
Figure 13:
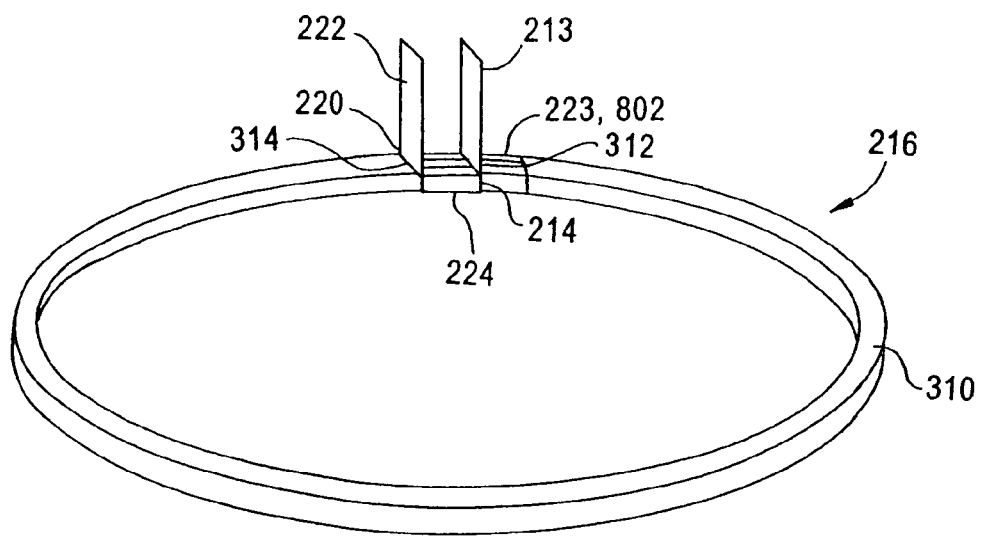
FIG. 13 is a perspective view of the antenna included in the embodiments of FIGS. 3, 4 and 8.

Reference is now made to the schematic diagram of FIG. 3 wherein fixed frequency RF source 232 (typically having a frequency of 4.0 MHz or 13.56 MHz) is illustrated as having an output that drives cable 106, having an output connected, via sensor 104, to one electrode of variable, series connected capacitor 212 of matching network 211. A second electrode of capacitor 212 is connected by current feed or post 213 to excitation terminal 214 of antenna 215, including coil 216; details of antenna 215 are illustrated in FIG. 13. Antenna 215 replaces antenna 48, FIG. 1. A first terminal of coil 216 is connected to grounded excitation terminal 220 via the series connection of ammeter 228 and fixed capacitor 426 (which is the equivalent of capacitor 126, FIG. 1).

The impedance of plasma 50 is indicated in FIG. 3 by the series impedance $Z_P$ (box 218) between the first end of coil 216 and capacitor 426. Variable capacitor 223, preferably a semiconductor of the type that is electronically controlled by a voltage applied to a control electrode thereof, is connected in series with excitation terminal 214 and a second end of coil 216. Opposite electrodes of fixed capacitor 224 are respectively connected to excitation terminals 214 and 220. Capacitors 212, 223 and 224 form impedance matching network 211 similar to impedance matching network 108 of FIG. 1. However, capacitors 223 and 224 are relocated onto antenna 215 so that the relatively high current that flows in these capacitors does not flow through rf feeds 213 and 222. In contrast, capacitors 112 and 114 of matching network 108 of the prior art are physically removed from antenna 48 and the relatively high currents that flow through capacitors 112 and 114 also flow through the rf leads that connect capacitors 112 and 114 to antenna 48.

A controller including microprocessor 229 controls the values of capacitors 212 and 223 to achieve (1) maximum current in ammeter 228 and, equivalently, (2) impedance matching between the output of source 210 and the load it drives, at the input of cable 106. To achieve these results, microprocessor 229 responds to the output of ammeter 228 or of sensor 104 to adjust (1) the capacitances of capacitors 212 and 223 until the output impedance of source 232 and the impedance the source drives are matched, or (2) until the current in coil 216, as measured by ammeter 228, is maximized. In response to one of these criteria being achieved, usually in an iterative manner, the current in the feeds is lower (typically about one-half to one-fifth) than the current in branch 225, and problems associated with high current flowing in feeds 213 and 222 discussed previously are avoided. Some of the current in coil 216 also flows in capacitor 224 and some in feeds 213 and 222. The phases of the instantaneous currents flowing in branch 225, and feeds 213 and 222 differ, such that the phase of the instantaneous current in coil 216 is about 90° from the instantaneous currents in feeds 213 and 222. Microprocessor 229 responds to indications of the current magnitude sensed by ammeter 228 or the phase angle, voltage magnitude and current magnitude as indicated by output signals of sensor 104. Microprocessor 229 responds to the output signals of ammeter 228 or sensor 104 to control the capacitances of capacitors 212 and 223 to maximize the current in coil 216 or so the impedance seen looking from cable 106 into sensor 104 equals the characteristic impedance of cable 106, i.e., a match is attained. If necessary, microprocessor 229 responds to the outputs of sensor 104 and ammeter 228 to iteratively control the values of capacitors 212 and 223 so that the current in coil 216 is maximized and the output impedance of source 210 is matched to the load it drives. Maximizing or nearly maximizing the current in coil 216 causes the electromagnetic field the coil supplies to the plasma to be maximized.

Reference is now made to FIG. 4 of the drawing, a schematic diagram of an embodiment which is similar to the embodiment of FIG. 3. FIG. 4 is the same as FIG. 3 except that ammeter 228 is eliminated and microprocessor 230 replaces microprocessor 229. Microprocessor 230 includes a conventional, prior art algorithm for controlling the impedances of a matching network of a plasma processor. Microprocessor 230 thus can be the same as microprocessor 20 of FIG. 1.

Microprocessor 230 controls capacitor 223 that is part of antenna 215 and part of matching network 211 to achieve an impedance match between source 232 and the load it drives. Such an impedance match is accompanied by the current in coil 216 being greater than the current flowing in feeds 213 and 222 from circuitry outside antenna 215. The coil current is typically two to five times current in feeds 213 and 222.

When microprocessor 230 has controlled capacitors 212 and 233 to achieve impedance matching of source 232 to the impedance it drives, the current that flows in coil 216 is maximized. It can be shown that a match between the output impedance of source 232 and the load the source drives is achieved when the current in coil 216 ($I_C$) is related to the current flowing in feeds 213 and 222 ($I_{IN}$) from circuitry outside antenna 215 in accordance with $$\frac{I_c}{I_{IN}} = \sqrt{\frac{R_0}{R_P}}$$

where $R_0$=the characteristic impedance of cable 106, and
$R_P$=the real part of impedance $Z_P$ of plasma 50 as coupled to coil 216.

Typical values of $R_0$ and $R_P$ are respectively 50 ohms and 2-10 ohms, resulting in $$\frac{I_c}{I_{IN}} = \sqrt{\frac{50}{2}} = \sqrt{25} = 5 \text{ and}$$

$$\frac{I_c}{I_{IN}} = \sqrt{\frac{50}{10}} = \sqrt{5} = 2.2$$

Hence, for the optimum impedance matching and maximum current in coil 216 (i.e., a resonant condition for the load that source 216 drives) the current in coil 216 is typically about two to five times the current flowing via feeds 213 and 224 through excitation terminals 214 and 220. However, for some non-optimum conditions, e.g., there is a slight impedance mismatch between source 232 and the load it drives or the current flowing in coil 216 is somewhat less than the maximum current that can flow in the coil for the frequency of source 232, the current in coil 216 is also about twice the current flowing through excitation terminals 214 and 220 via feeds 213 and 224, for values of plasma resistance less than 10 ohms.

It can be shown that matching between the output impedance of source 232 and the load the source drives results when $$\frac{1}{\omega C_3} = \omega L + \omega L_P - \frac{1}{\omega C_2} \pm \sqrt{\frac{R_P}{R_0 \omega^2 C_2^2} - R_P^2} \text{ and}$$

$$\frac{1}{\omega C_1} = -\frac{1}{\omega C_2} \pm \sqrt{\frac{R_0}{R_P \omega^2 C_2^2} - R_0^2}$$

where

ω=2π×f f=frequency of source 232

$C_1$=capacitance of capacitor 212

$C_2$=capacitance of capacitor 224 and $C_3$=series capacitance of capacitors 223 and 426

L=inductance of coil 216

$R_P$=real part of effective plasma impedance $Z_P$ (218), and $L_P$=inductance of effective plasma impedance $Z_P$ (218)

For typical values of: f=13.56 MHz, $R_0$=50 ohms, $R_P$=5 ohms, $C_2$=100 pf, L=2.2 μH, and $L_P$=−0.2 μH, $C_1$=47 pf and $C_3$=131 pf (by taking the positive value of the square root for the values of $C_1$ and $C_3$).

Figure 5:
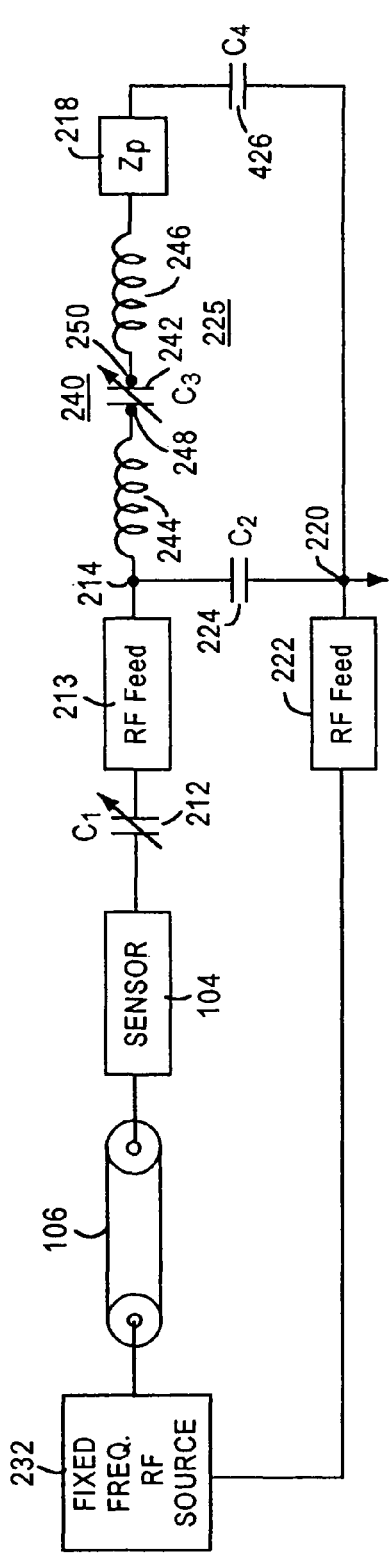

Reference is now made to FIG. 5, which is the same as FIG. 4 except that coil 216 and capacitor 223 are respectively replaced by coil 240 and variable capacitor 242. The capacitances of capacitors 212 and 242 are controlled by a microprocessor (not shown in FIG. 5) in the same way that microprocessor 230 controls capacitors 212 and 223.

Coil 240 includes two series connected segments 244 and 246, having a gap between them. The gap is defined by a pair of terminals 248 and 250 of coil 240. Terminals 248 and 250 are respectively connected to opposite electrodes of capacitor 242 so that capacitor 242 is connected in series with segments 244 and 246. The gap between terminals 248 and 250 is preferably located at a location in coil 240 which provides optimum distribution of current and voltage along the length of the coil, as described in U.S. Pat. No. 6,441,555.

Figure 6:
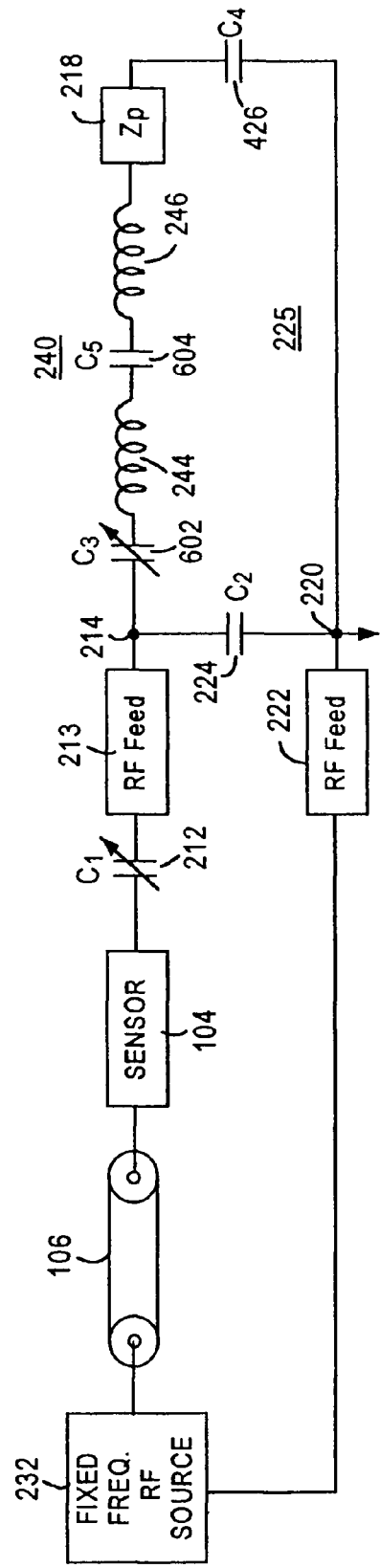

Reference is now made to FIG. 6, which is the same as FIG. 5, except that variable capacitor 242 is replaced by variable capacitor 602 and fixed capacitor 604. Capacitors 212 and 602 are controlled by a microprocessor (not shown in FIG. 6) in the same way that microprocessor 230 controls capacitors 212 and 223.

Variable capacitor 602 is connected between terminal 214 and one end of coil segment 244, the other end of which is connected to one electrode of capacitor 604. A second electrode of capacitor 604 is connected to one end of coil segment 246. The location of capacitor 604 in coil 240 is typically different from the location of capacitor 242 because capacitor 602 changes the voltage and current distribution in coil 240.

Reference is now made to FIG. 7 of the drawing, which is the same as FIG. 5 except that variable frequency source 233 replaces fixed frequency source 232, microprocessor 231 replaces the microprocessor of FIG. 5 and fixed capacitor 702 replaces variable capacitor 242. Variable frequency source 233 typically has a range of frequencies that is typically about ±10% of the center frequency of the source. Microprocessor 231 responds to the indications derived by sensor 104, to control (in a known manner) the frequency of source 233 and the capacitance of capacitor 212 until the microprocessor detects an impedance match between the source and the load it drives. The combination of indications sensor 104 derives indicates the impedance match between source 233 and the load it drives. As a result of microprocessor 231 controlling the frequency of source 233 and the capacitance of capacitor 212 to achieve the impedance match, plasma impedance 218, capacitors 426 and 702, as well as coil segments 244 and 246, have impedances that cause the current in coil segments 244 and 246 to exceed the current flowing through feeds 213 and 222 from the circuitry outside antenna 215; typically, the current in coil segments 244 and 246 is about two to five times the current in feeds 213 and 222 since $$\frac{I_c}{I_{IN}} = \sqrt{\frac{R_0}{R_P}}$$

and the values of $R_0$ and $R_P$ are typically as previously stated. It is to be understood that the frequency of source 233 can alternatively be controlled in response to a signal that detects a maximum current in branch 225, as described in connection with FIG. 3.

Reference is now made to FIG. 8 that is the same as FIG. 4 except that variable frequency source 233 replaces fixed frequency source 232, a microprocessor (not shown in FIG. 8) that is the same as microprocessor 231 replaces microprocessor 230 and fixed capacitor 802 replaces variable capacitor 223. The microprocessor of FIG. 8 controls the frequency of source 233 and the value of capacitor 212 as described in connection with FIG. 7.

Figure 9:
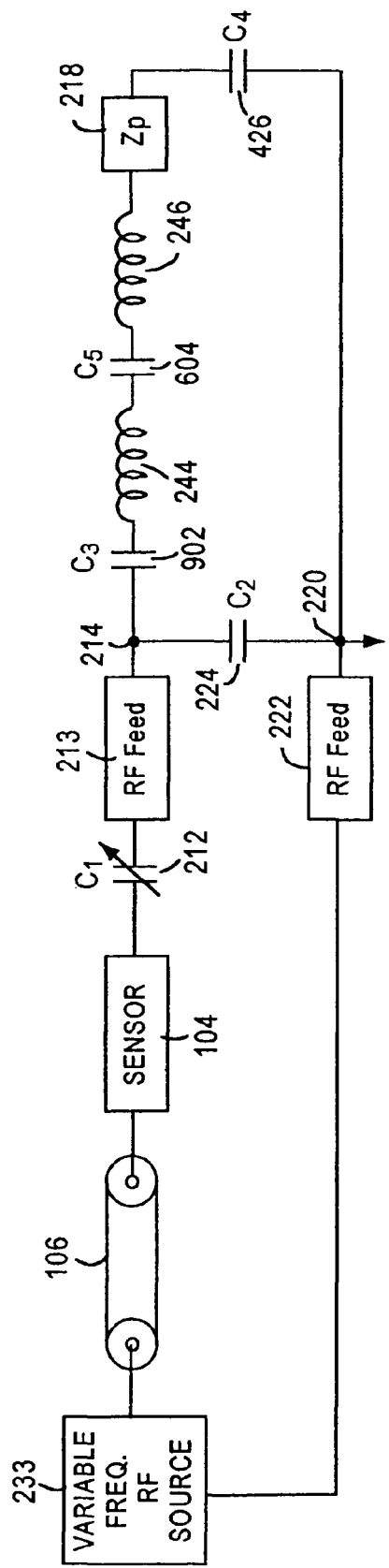

Reference is now made to FIG. 9, which is the same as FIG. 6, except that variable frequency source 233 replaces fixed frequency source 232, a microprocessor (not shown) that is the same as microprocessor 231 replaces the microprocessor of FIG. 6, and fixed capacitor 902 replaces variable capacitor 602. The microprocessor of FIG. 9 controls the frequency of source 233 and the value of capacitor 212 as described in connection with FIG. 7.

Figure 10:
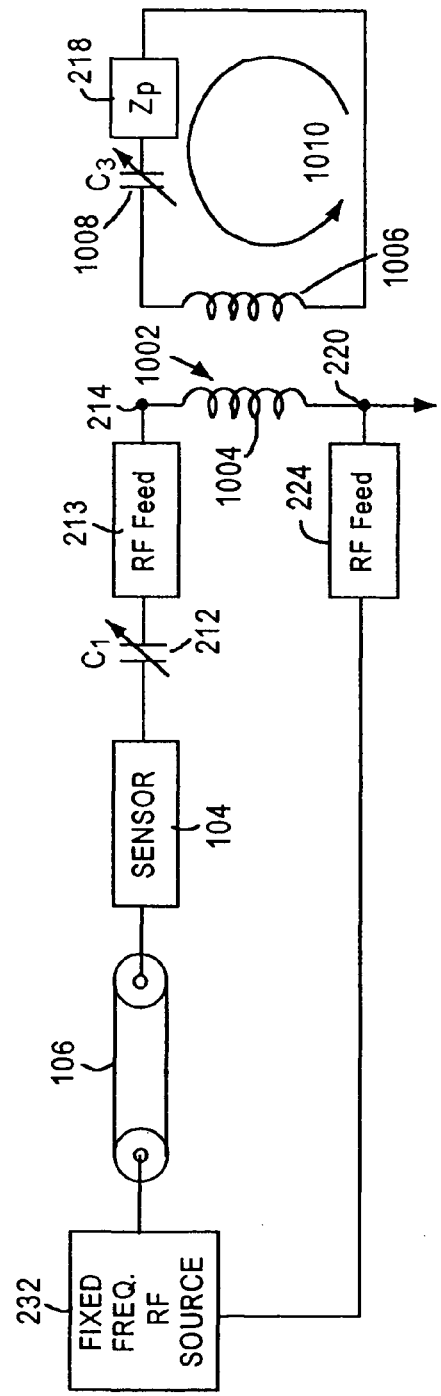

Reference is now made to FIG. 10 wherein the antenna of FIG. 4 is modified to include air core transformer 1002 including primary winding 1004 and secondary winding 1006 that drives the plasma load impedance 218 and is in series with variable capacitor 1008. Opposite ends of primary winding 1004 are connected to excitation terminals 214 and 220, so that the primary winding is in series with variable capacitor 212 of the matching network. Primary winding 1004 can thus be considered as part of the matching network. Fixed frequency source 232 is connected in series with cable 106, variable capacitor 212, RF feeds 213 and 224, and winding 1004 so that substantially the same current flows in winding 1004 as is derived by source 232.

Secondary winding 1006, variable capacitor 1008 and plasma impedance 218 are in series in nearly resonant closed loop 1010. A microprocessor (not shown) that is the same as microprocessor 230 responds to the output signals of sensor 104 to control the capacitances 212 and 1008. The control is such that there is an impedance match between source 232 and the load the source drives. When the match occurs, loop 1010 has an impedance with a resonant frequency that is nearly the same as the frequency of the source, i.e., load 1010 is nearly resonant to the fixed frequency of source 232.

To prevent the high amplitude, near resonant current that flows in loop 1010 from being coupled to primary winding 1004, as well as feeds 213 and 224, windings 1004 and 1006 are loosely coupled. The loose coupling between windings 1004 and 1006 results in the impedance of loop 1010 that is nearly resonant to the frequency of source 232 being coupled with a large resistive component to winding 1004. Consequently, the current flowing through feeds 213 and 224 has an amplitude that is much lower than the current flowing in loop 1010. A typical coupling coefficient between windings 1004 and 1006 to achieve the desired loose coupling effect and provide a relatively efficient transfer of power from winding 1004 to winding 1006 is in the range of about 0.1 to 0.3. This coefficient range results in transformer 1002 having an efficiency of about 70 percent to 90 percent.

Reference is now made to FIG. 11, a modification of FIG. 10, wherein variable frequency source 233 replaces fixed frequency source 232, a microprocessor (not shown) configured the same as microprocessor 231 replaces the microprocessor of FIG. 10 and fixed capacitor 1102 replaces variable capacitor 1008. Microprocessor 233 responds to the output signals of sensor 104 to control the (1) value of capacitor 212 and frequency of source 233 to provide an impedance match between source 232 and the load it drives. When the match occurs, the frequency of source 233 and the resonant frequency of loop 1010 are nearly the same.

Reference is now made to FIG. 12, which is the same as FIG. 11, except that the antenna includes air core transformer 257 including primary winding 258 and secondary windings 346 and 348, both of which (1) are loosely coupled with the primary winding, and (2) drive the plasma impedance 218. As described in connection with FIG. 16, the inductive and capacitive coupling between windings 346 and 348 and plasma impedance 218 is greater than the inductive and capacitive coupling between winding 258 and the plasma impedance. Secondary windings 346 and 348 are connected in series with fixed capacitors 254 and 256 to form closed loop 2002. Capacitors 254 and 256 are located to provide a desired distribution of current and voltage along the length of the closed loop 1202 formed by windings 346 and 348, as well as capacitors 254 and 256. The combined coupling coefficient between winding 258 and windings 346 and 348 is approximately in the 0.1 to 0.3 range. A microprocessor (not shown) that is the same as microprocessor 231 responds to output signals of sensor 104 to control the value of capacitor 212 and the frequency of source 233 to provide an impedance match between source 232 and the load it drives. When the impedance match is achieved, the source frequency and the resonant frequency of loop 1202 are nearly the same.

It is to be understood that an ammeter can be connected to loops 1010 and 1202 to control the capacitance of capacitor 1008 (FIG. 10) and the frequency of source 233 (FIGS. 11 and 12) so maximum current in loops 1010 and 1202 is achieved. Maximizing the current in loops 1010 and 1202 results from the impedances of the loop being resonant to the frequencies of sources 232 or 233.

It is also to be understood that it is not necessary for the current in the plasma excitation coil to be maximized or nearly resonant to the frequency of the fixed or variable frequency sources of FIGS. 10-12 or for an exact impedance match to be achieved to enable the current in the excitation coil to exceed the current flowing in leads 213 and 222 via circuitry outside the antenna, although these are the most desirable conditions for efficient transfer of electromagnetic energy from the coil to plasma. The value of the variable capacitor series connected to the coil or the frequency of the source can be adjusted by using other arrangements that cause the coil current to exceed the current in the RF feeds. For example, the source frequency and capacitor(s) series connected to the coil can be fixed at values which cause the coil current to exceed the current in the RF feeds and approximate matching can be attained by controlling the value of only capacitor 212.

In the transformers of FIGS. 10-12, the primary and secondary windings are only reactively coupled to each other and there is no direct connection from the secondary windings 262 to the RF sources. Secondary winding 1006 is in close proximity to window 46 so that secondary winding 1006 is the main supplier of magnetic and electric fields to plasma 50, i.e., secondary winding 1006 supplies a considerably greater amount of magnetic and electric fields to the plasma than primary winding 1004. Windings 1004 and 1006 are typically substantially planar, and lie in planes parallel to each other and a planar face of window 46.

In a preferred embodiment of FIG. 12, primary winding 258 includes a single loop in a first plane, while secondary windings 346 and 348 together include four coaxial turns, which are also coaxial with the single loop of primary winding 258 and are closed on themselves. The coaxial turns of windings 346 and 348 are arranged so that the two turns of winding 346 are in a second plane and the two turns of winding 348 are in a third plane; the second and third planes are parallel to the first plane. The planes of the turns of windings 258, 346 and 348 are parallel to a plane of a face of window 46, such that the planes of secondary windings 346 and 348 are closer to window 46 than the plane of primary winding 258, with winding 348 being closer to the window than winding 346. The coaxial turns of windings 346 and 348 are connected to each other so that current instantaneously flows in the same direction in the turns of windings 346 and 348 in a half plane intersecting a common axis of the loop of primary winding 258 and the turns of windings 346 and 348.

Reference is now made to FIG. 13 of the drawing, a perspective view of the antenna of each of FIGS. 3, 4 and 8, in combination with current feeds or posts 213 and 222. (To simplify the drawing of FIG. 13, ammeter 228 of FIG. 3 is omitted.) Antenna coil 216 includes a single planar, substantially circular nonmagnetic metal loop 310, formed as a sector of a circle, wherein the sector has an extent of approximately 340 degrees. Loop 310 is disposed in a plane parallel and in close proximity to the upper face of window 46. Loop 310 has a vertically extending central axis that is coincident with the center of workpiece 54, when the workpiece is properly positioned on chuck 52.

Loop 310 includes a pair of end terminals 312 and 314 electrically coupled with excitation terminals 214 and 220. Excitation terminals 214 and 220 are at the ends of and are ohmically connected to vertically extending current feeds or posts 213 and 222, that are directed upwardly from the plane of loop 310. Capacitor 224 bridges a gap between excitation terminals 214 and 220, while capacitor 223 bridges a gap in loop 310 between excitation terminals 214 and end terminal 312. Excitation terminal 220 and end terminal 314 are coincident.

Figure 14:
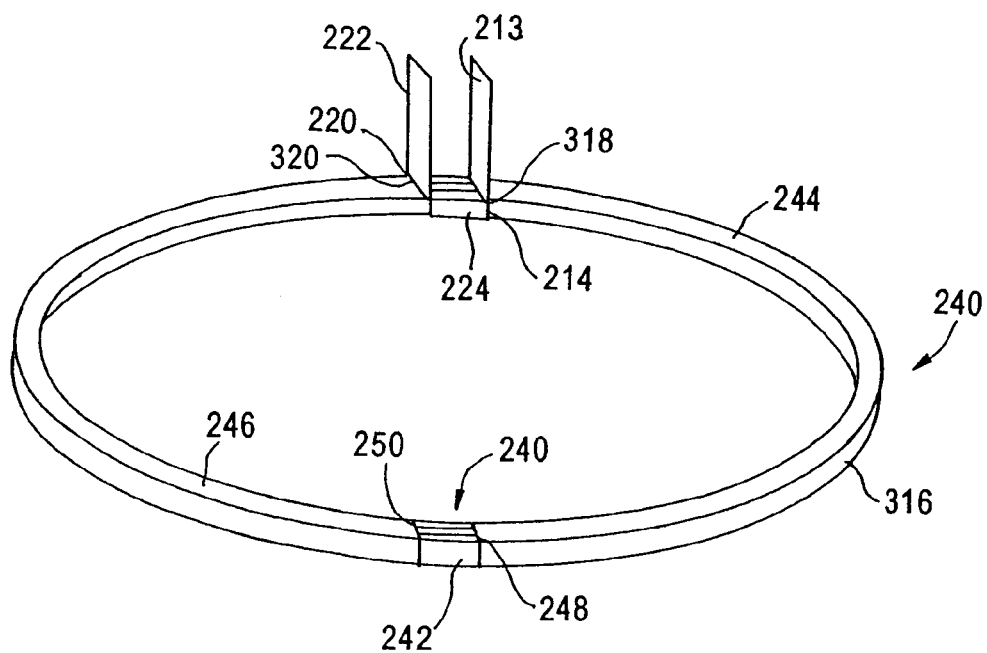
FIG. 14 is a perspective view of a the antenna included in the embodiments of FIGS. 5 and 7.

Reference is now made to FIG. 14 of the drawing, a perspective view of the antenna of FIGS. 5-7, in combination with current feeds or posts 213 and 222. The antenna of FIG. 14 includes coil 240 having a single planar, non-magnetic, metal, substantially circular loop 316, formed as two sectors of a circle, wherein the sectors have a combined extent of approximately 340 degrees. The sectors form segments 244 and 246. Loop 316 is disposed in a plane parallel and in close proximity to the upper face of window 46. Loop 316 has a vertically extending axis that is coincident with the center of workpiece 54, when the workpiece is properly positioned on chuck 52.

Loop 316 includes a pair of end terminals 318 and 320 that are respectively coincident with excitation terminals 214 and 220. Capacitor 234 bridges the gap between excitation terminals 214 and 220, while capacitor 242 bridges a gap between terminals 248 and 250 of loop 316. Each of the gaps has an arcuate extend of about 10 degrees. While the gap in loop 316 between terminals 248 and 250 is illustrated in FIG. 14 as diametrically opposed to the gap between excitation terminals 214 and 220, it is to be understood that the gap in loop 316 is preferably at a location in the loop which results in optimum distribution of current and voltage in the loop. Also, it is be understood that loops 310 and 316 can have plural capacitors between the end terminals thereof. For example, the embodiments of FIGS. 6 and 9 are realized by a combination of FIGS. 13 and 14.

Figure 15:
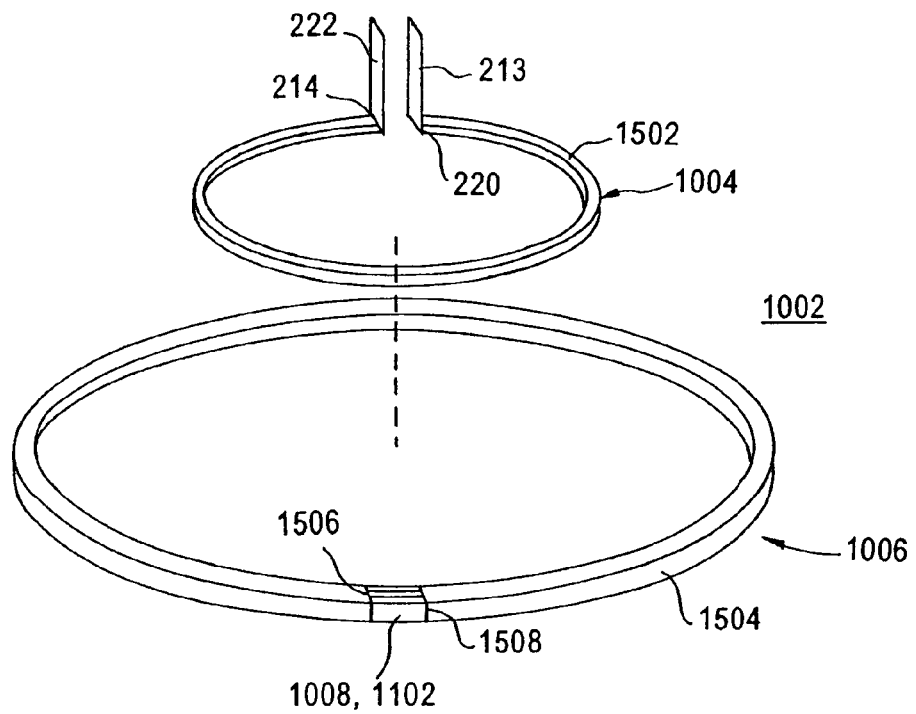
FIG. 15 is a perspective view of an antenna including a transformer having primary and secondary windings, as schematically illustrated in FIGS. 10 and 11.

Reference is now made to FIG. 15 of the drawing, a perspective view of the antenna illustrated in FIGS. 10 and 11. The antenna of FIG. 8, illustrated in FIG. 15 in combination with current feeds 213 and 222, includes primary winding 1004 and secondary winding 1006. Secondary winding 1006 is only reactively coupled to primary winding 1004, such that there is no ohmic connection from source 232 or 233 or the primary winding to the secondary winding. Primary winding 1004 includes a single planar, non-magnetic, metal substantially circular loop 1502, formed as a sector of a circle, wherein the sector has an extent of approximately 350 degrees. Primary winding 1004 has a pair of opposite ends coincident with and ohmically connected to excitation terminals 276 and 278, which are respectively connected to upwardly extending current feeds 213 and 222. Secondary winding 1006 includes a single planar, non-magnetic, metal, circular loop 1504 including a gap between a pair of terminals 1506 and 1508. Capacitor 1008 (FIG. 10) or 1102 (FIG. 11) is located in the gap such that opposite electrodes thereof are respectively connected to terminals 1506 and 1508. Again, it is be understood that loop 326 can include plural gaps, each including a separate capacitor.

Loops 1502 and 1504, as well as the upper face of window 46, are in mutually parallel planes such that loop 1504 is in close proximity to window 46 and loop 1506 is remote from the window. The distance separating loop 1506 and window 46 is sufficient to provide substantial decoupling of the magnetic and electric fields originating in loop 1506 from plasma 50 in vacuum chamber 40. The distance between loop 1506 and window 46 is such that there is substantial coupling of the magnetic and electric fields originating in loop 1506 to plasma 50. The distance between loops 1504 and 1506 is such that there is a transformer coupling coefficient between 0.1 and 0.3 between these loops. Typically, loop 1506 has a greater diameter than loop 1504, to assist in providing proper coupling of magnetic fields from loop 1504 to loop 1506. In one embodiment, loop 1506 has a diameter of approximately 150 mm (i.e. approximately six inches), to provide plasma processing of workpieces having diameters of 200 mm and 300 mm. Loops 1504 and 1506 are coaxial and thus include a common axis which intersects the center of workpiece 54 when the workpiece is properly positioned on chuck 52. Because loop 1506 is circular and essentially closed on itself, loop 1506 approximates a perfect coil to provide plasma 50 with magnetic fields that are close to being azimuthally symmetrical.

Figure 16:
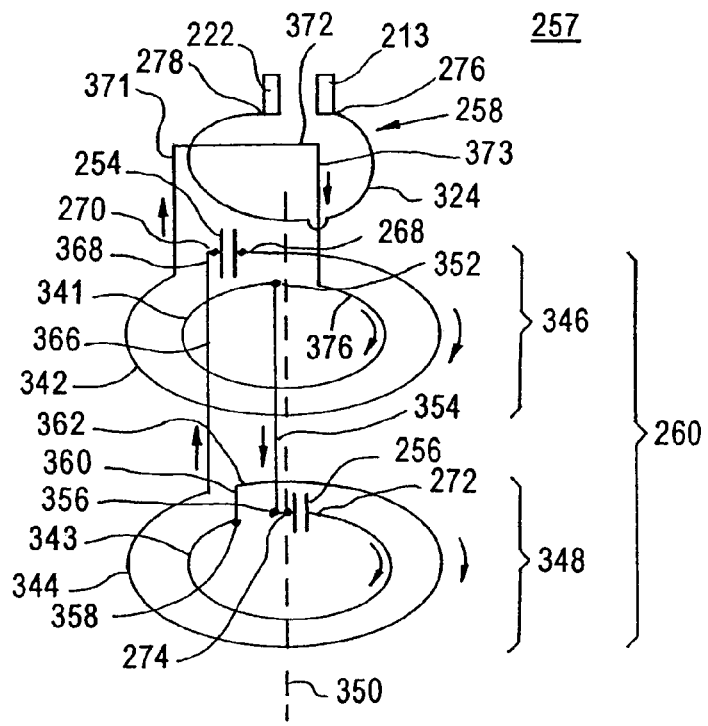
FIG. 16 is a schematic perspective view of an antenna including a transformer having a primary winding and a four-turn secondary winding, as schematically illustrated in FIG. 12.

Reference is now made to FIG. 16 of the drawing, a schematic perspective view of the antenna including transformer 257 that is schematically illustrated in FIG. 12. The combined inductance of secondary windings 346 and 348, as illustrated in FIG. 16, is substantially larger than the inductance of secondary winding 1006, as illustrated in FIG. 15. The larger combined inductance of secondary windings 346 and 348 facilitates resonating the impedance associated with the coil of FIG. 16 to the frequency of source 232 or 233.

Primary winding 258, constructed basically the same as primary winding 1004, includes planar non-magnetic, metal loop 324 having ends 276 and 278 that are coincident with terminals 214 and 220 and ohmically connected to current feeds 213 and 222.

Secondary windings 346 and 348, together, include four substantially circular, nonmagnetic metal planar loops (i.e. turns) 341-344, each formed as a sector of a circle, wherein each sector has an extent of approximately 340 degrees. Turns 341 and 342 of winding 346 are coplanar in a first plane while turns 343 and 344 of winding 348 are coplanar in a second plane. The first and second planes are parallel to each other and the upper face of window 46. The planes including windings 346 and 348 are also parallel to the plane of planar loop 324 of the primary winding 258 of transformer 257. Each of loops 324, 341 and 343 has the same diameter that is somewhat less than the equal diameters of loops 342 and 344. All of loops 258 and 341-344 are coaxial with vertically extending axis 350 that intersects the center of workpiece 54 when the workpiece is correctly positioned on chuck 52.

The planes including windings 346 and 348 are relatively close to the upper surface of window 46, with plane 346 being farther from the window than plane 348. The planes including windings 346 and 348 are considerably closer to window 46 than the plane of loop 324, so that substantial magnetic flux from loops 341-344 is coupled to plasma 50 and a relatively small amount of magnetic flux from loop 324 is directly coupled to plasma 50. The planes including windings 346 and 348, however, are sufficiently close to the plane of loop 324 so substantial magnetic flux is coupled from loop 324 to loops 341-344, to provide a transformer coupling coefficient between the primary winding including loop 324 and the secondary winding including loops 341-344 in the range of 0.1 to 0.3, approximately.

Loops 341-344 are connected in series with each other so that the RF current induced in them in response to magnetic flux resulting from RF current flowing in primary winding 258 flows in the same direction in a vertical half plane originating at axis 350 and extending through loops 341-344. Thus, at one instant of time, the currents in the right hand portions of loops 341-344 (as illustrated in FIG. 16) flow in a horizontal plane toward a viewer. At the same instant of time, the currents in the left hand portions of turns 341-344 flow in a horizontal plane away from a viewer. Consequently, the magnetic fluxes originating in turns 341-344 add in plasma 50.

To these ends, loop 341 includes a first end 352 connected by vertically extending lead 354 to a first end 356 of loop 343, having a second end 358 connected by lead 360 to a first end 362 of loop 344. Lead 360 is coplanar with loops 343 and 344. Turn 344 has a second end 364 connected by vertically extending lead 366 to a first end 368 of loop 342. Turn 342 has a second end 370 connected by leads 371-373 to a second end 376 of loop 341. Leads 371 and 373 extend vertically through the plane including loop 324 and have ends above the plane of loop 324. The upper ends of leads 371 and 373 are connected together by horizontally extending lead 372. Positioning leads 371-373 in this way decreases the tendency for current flowing in these leads affecting the magnetic fluxes that loops 341-344 supply to plasma 50. Loops 341-344 are connected in series with each other and capacitors 254 and 256 by leads 354, 356, 366 and 371-373 in such a manner that loops 341-344 are closed on each other. The entire series circuit forms a closed loop in the antenna of FIG. 16. The fact that turns 341-344 are closed on each other and are substantially circular assists in providing the desired substantially symmetrical azimuthal magnetic flux coupling to plasma 50 and substantially symmetrical azimuthal density of plasma 50.

Loops 342 and 343 include gaps, such that the gap in loop 342 is defined by terminals 268 and 270, while the gap in loop 343 is defined by terminals 272 and 274. Terminal 270 is substantially coincident with end 368 of loop 342, while terminal 274 is substantially coincident with end 356 of loop 343.

Capacitors 254 and 256 are respectively in the gaps of loops 342 and 343. This location of capacitors 254 and 256 is such that the inductances of the turns between opposite electrodes of the capacitors are approximately equal, resulting in a preferred distribution of the current and voltage along the length of the closed loop including secondary windings 346 and 348. The values of capacitors 254 and 256, and the inductances of loops 258 and 341-344 and the mutual inductance between loop 258 and loops 341-344, result in the reactive impedance of closed loop 1202 including secondary windings 346 and 348 having a resonant frequency equal to a frequency in the range of frequencies that source 233 can derive. Microprocessor 231 controls the frequency of source 233 so that the impedance of source 233 is matched to the impedance of the load the source drives, resulting in the frequency of source 231 nearly being equal to the resonant frequency of closed loop 1202.

While there have been described and illustrated specific embodiments of the invention, it will be clear that variations in the details of the embodiments specifically illustrated and described may be made without departing from the true spirit and scope of the invention as defined in the appended claims. For example, the matching network can have a configuration other than the specifically described configurations of FIGS. 3-12; for example, an "L" or "π" configuration can be employed. To simplify the analysis, transmission line effects of the antenna, which can be significant at 13.56 MHz, have been ignored.

We claim:

1. An antenna for a plasma processor, the antenna being adapted to be driven by power from an AC source for exciting a plasma, comprising first and second excitation terminals, a plasma excitation coil including a transformer having (a) a primary winding having opposite ends respectively coupled with the first and second excitation terminals, and (b) a first secondary winding and a second secondary winding reactively coupled with the primary winding and adapted to be coupled with a plasma processing chamber of the plasma processor so that magnetic fluxes from the first and second secondary windings add in the plasma in the chamber without any additional winding configured to couple the magnetic fluxes to the plasma processing chamber, and wherein the first secondary winding and the second secondary winding act together as an antenna for inductively coupling plasma inside the plasma processing chamber.

2. The antenna of claim 1 wherein the first and second secondary windings are arranged to be excited by the AC source only via the reactive coupling with the primary winding.

3. The antenna of claim 2 wherein a transformer coupling coefficient between the windings is such that there is loose coupling of the impedance of the first and second secondary winding to the primary winding.

4. The antenna of claim 3 wherein the coupling coefficient is in the range of about 0.1 to 0.3.

5. The antenna of claim 1 wherein the first and second secondary windings are in different parallel planes adapted to be spatially parallel to a coupling window of a vacuum chamber of the processor.

6. The antenna of claim 5 wherein the first and second secondary windings include turns which are concentric with an axis of the coil, the primary winding including at least one further turn that is concentric with the coil axis and is in a plane spatially parallel to the plural turns of the secondary winding.

7. The antenna of claim 6 wherein each of the first and second secondary windings includes multiple turns in each of the planes.

8. The antenna of claim 7 wherein the turns of the first and second secondary windings are connected in series with each other and arranged so AC current induced to flow therein in response to excitation of the primary winding flows in the same direction in half planes extending from the axis through the turns.

9. The antenna of claim 8 wherein the turns of each of the first and second secondary windings are closed on themselves.

10. The antenna of claim 9 wherein the plural turns are closed on themselves.

11. The antenna of claim 10 wherein a transformer coupling coefficient between the windings is such that there is loose coupling of the impedance of the first and second secondary windings to the primary winding.

12. A plasma processor including the antenna of claim 11, the processor including the AC source and a vacuum chamber having an interior arranged to be responsive to electromagnetic fields derived by the antenna in response to excitation by the AC source.

13. A plasma processor including the antenna of claim 1, the processor including the AC source and a vacuum chamber having an interior arranged to be responsive to electromagnetic fields derived by the antenna in response to excitation by the AC source.

* * * * *